United States Patent
Kang

(10) Patent No.: US 11,233,500 B1
(45) Date of Patent: Jan. 25, 2022

(54) CLOCK DISTRIBUTION NETWORK, A SEMICONDUCTOR APPARATUS AND A SEMICONDUCTOR SYSTEM USING THE SAME

(71) Applicant: SK hynix Inc., Icheon-si (KR)

(72) Inventor: Ji Hyo Kang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/146,988

(22) Filed: Jan. 12, 2021

(30) Foreign Application Priority Data

Jul. 22, 2020 (KR) ........................ 10-2020-0090729

(51) Int. Cl.
| | |
|---|---|
| G06F 1/10 | (2006.01) |
| H03K 3/037 | (2006.01) |
| G06F 1/08 | (2006.01) |
| G06F 1/12 | (2006.01) |
| G11C 7/22 | (2006.01) |

(52) U.S. Cl.
CPC ............... *H03K 3/037* (2013.01); *G06F 1/08* (2013.01); *G06F 1/10* (2013.01); *G06F 1/12* (2013.01); *G11C 7/222* (2013.01)

(58) Field of Classification Search
CPC ...................................... G06F 1/04; G06F 1/10
See application file for complete search history.

(56) References Cited

U.S. PATENT DOCUMENTS

| | | | |
|---|---|---|---|
| 6,208,702 B1 | 3/2001 | Ghoshal | |
| 7,759,992 B2 * | 7/2010 | Ibuka | H03L 7/095 327/158 |
| 8,536,922 B2 | 9/2013 | Lin | |
| 9,830,960 B2 * | 11/2017 | Lee | G11C 11/4093 |
| 10,712,769 B2 * | 7/2020 | Zhang | G06F 1/10 |
| 2020/0293082 A1 * | 9/2020 | Jang | G06F 1/10 |

* cited by examiner

*Primary Examiner* — Patrick O Neill
(74) *Attorney, Agent, or Firm* — William Park & Associates Ltd.

(57) ABSTRACT

A clock distribution network includes a global driver configured to receive a pair of clock signals to generate a pair of global clock signals, a clock transmission driver configured to amplify the pair of global clock signals to generate a pair of transmission clock signals, a first boosting circuit configured to boost voltage levels of the pair of transmission clock signals to generate a pair of first boosted clock signals, a first local driver configured to shift voltage levels of the pair of first boosted clock signals to generate a pair of first local clock signals, a second boosting circuit configured to boost voltage levels of the pair of first boosted clock signals to generate a pair of second boosted clock signals, and a second local driver configured to shift voltage levels of the pair of second boosted clock signals to generate a pair of second local clock signals.

19 Claims, 6 Drawing Sheets

<WHEN BOOSTING CIRCUIT IS NOT PROVIDED>

<WHEN BOOSTING CIRCUIT IS PROVIDED>

US 11,233,500 B1

CLOCK DISTRIBUTION NETWORK, A SEMICONDUCTOR APPARATUS AND A SEMICONDUCTOR SYSTEM USING THE SAME

CROSS-REFERENCES TO RELATED APPLICATION

The present application claims priority under 35 U.S.C. § 119(a) to Korean application number 10-2020-0090729, filed on Jul. 22, 2020, in the Korean Intellectual Property Office, which is incorporated herein by reference in its entirety.

BACKGROUND

1. Technical Field

Various embodiments are related to an integrated circuit, and more particularly, to a clock distribution network, including a semiconductor apparatus and a semiconductor system using the clock distribution network.

2. Related Art

Electronic devices include many electronic elements. A computer system, for example, includes many semiconductor apparatuses, each including a semiconductor. Semiconductor apparatuses configured a computer system may operate in synchronization with a clock signal. The semiconductor apparatuses may communicate with each other by receiving and transmitting data in synchronization with the clock signal. As the operation speed of the computer system increases, the frequency of the clock signal becomes greater and the amplitude of the clock signal becomes smaller. In general, each of semiconductor apparatuses may include a current mode logic (CML) driver for effectively amplifying a clock signal having a high frequency and a small amplitude, and may amplify the clock signal to a CML level to output the amplified clock signal. Because internal circuits within the semiconductor apparatuses are supposed to operate in synchronization with a clock signal of a Complementary Metal-Oxide Semiconductor (CMOS) level, a CML to CMOS converter may be provided to convert a level of the clock signal, which is transferred through the CML driver, to the CMOS level before the clock signal transferred through the CML driver is provided to the internal circuits. Because there are a great number of internal circuits within a semiconductor apparatus, a clock transmission line may inevitably become longer to transfer the clock signal to the great number of internal circuits and/or the CML to CMOS converter, and a load on the clock transmission line may inevitably become greater. Therefore, the semiconductor apparatus may include a CML driver having a more powerful driving force and consuming a greater amount of current. Also, even though the semiconductor apparatus includes a CML driver having a more powerful driving force, an amplitude of the clock signal transferred to the internal circuits inevitably becomes smaller as the transmission line becomes longer between the CML driver and the internal circuits.

SUMMARY

In an embodiment, a clock distribution network may include a global driver, a clock transmission driver, a first boosting circuit, a first local driver, a second boosting circuit and a second local driver. The global driver may be configured to receive a pair of clock signals to generate a pair of global clock signals. The clock transmission driver may be configured to amplify the pair of global clock signals to generate a pair of transmission clock signals. The first boosting circuit may be configured to boost voltage levels of the pair of transmission clock signals to generate a pair of first boosted clock signals. The first local driver may be configured to shift voltage levels of the pair of first boosted clock signals to generate a pair of first local clock signals. The second boosting circuit may be configured to boost voltage levels of the pair of first boosted clock signals to generate a pair of second boosted clock signals. The second local driver may be configured to shift voltage levels of the pair of second boosted clock signals to generate a pair of second local clock signals.

In an embodiment, a semiconductor apparatus may include a first local driver, a first data input/output circuit, a first boosting circuit, a second local driver, and a second data input/output circuit. The first local driver may be configured to receive a pair of first transmission clock signals and shift voltage levels of the pair of first transmission clock signals to generate a pair of first local clock signals. The first data input/output circuit may be configured to perform a data input/output operation in synchronization with the pair of first local clock signals. The first boosting circuit may be configured to boost voltage levels of the pair of first transmission clock signals to generate a pair of second transmission clock signals. The second local driver may be configured to receive the pair of second transmission clock signals and shift voltage levels of the pair of second transmission clock signals to generate a pair of second local clock signals. The second data input/output circuit may be configured to perform a data input/output operation in synchronization with the pair of second local clock signals.

DETAILED DESCRIPTION

Figure 1:
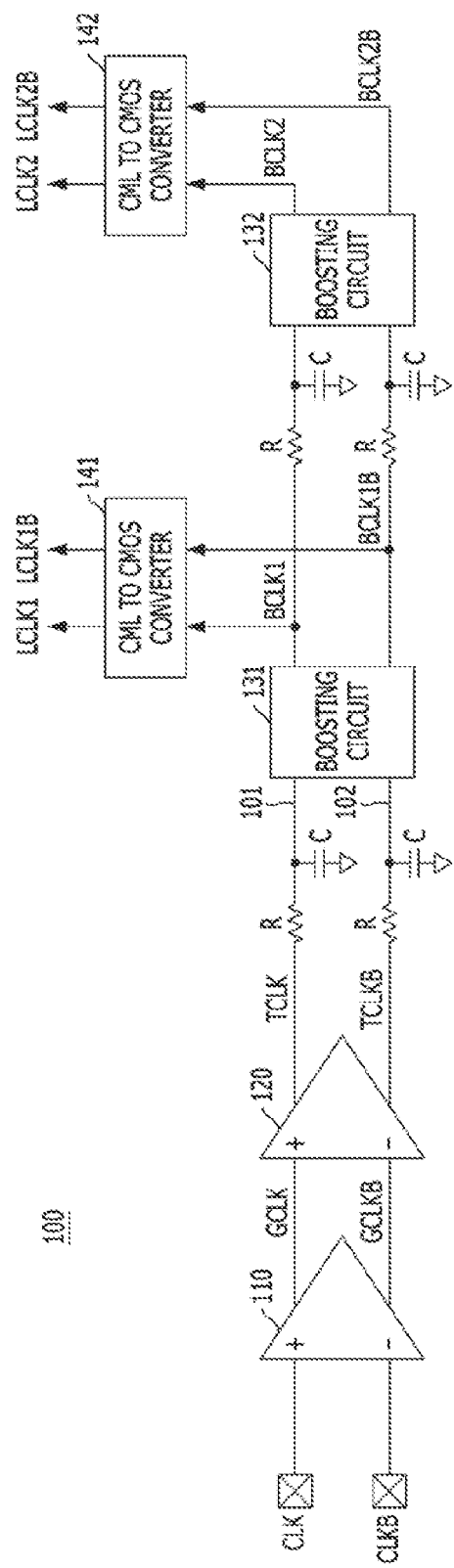
FIG. 1 is a diagram illustrating a configuration of a clock distribution network in accordance with an embodiment.

FIG. 1 is a diagram illustrating a configuration of a clock distribution network 100 in accordance with an embodiment. Referring to FIG. 1, the clock distribution network 100 may receive a pair of clock signals CLK and CLKB to generate a pair of transmission clock signals TCLK and TCLKB and may provide the pair of transmission clock signals TCLK and TCLKB to a plurality of internal circuits. The clock distribution network 100 may provide the pair of transmission clock signals TCLK and TCLKB to the plurality of internal circuits through clock transmission lines 101 and 102. The pair of transmission clock signals TCLK and TCLKB transferred through the clock transmission lines 101 and 102 may have a Current Mode Logic (CML) level. The pair of transmission clock signals TCLK and TCLKB might have a limited swing range and not fully swing between levels of a power voltage and a ground voltage. The plurality of internal circuit may include any circuit configured to perform a predetermined operation based on the pair of transmission clock signals TCLK and TCLKB. Each of the plurality of internal circuits may be coupled to the clock transmission lines 101 and 102. Each of the plurality of internal circuits may generate a pair of local clock signals based on the pair of transmission clock signals TCLK and TCLKB. The pair of local clock signals may have a Complementary Metal-Oxide Semiconductor (CMOS) level and may fully swing between the levels of the power voltage and the ground voltage. Each of the plurality of internal circuits may include a CML to CMOS converter configured to convert the pair of transmission clock signals TCLK and TCLKB having the CML level to the pair of local clock signals having the CMOS level. The clock distribution network 100 may include a boosting circuit configured to couple an internal circuit disposed closer to a source of the pair of transmission clock signals TCLK and TCLKB to an internal circuit disposed farther from the source of the pair of transmission clock signals TCLK and TCLKB. The boosting circuit may boost the voltage levels of the pair of transmission clock signals TCLK and TCLKB transferred through the clock transmission lines 101 and 102, so that the internal circuit disposed farther from the source of the pair of transmission clock signals TCLK and TCLKB may receive the pair of transmission clock signals TCLK and TCLKB having sufficient amplitudes.

The clock distribution network 100 may include a global driver 110, a clock transmission driver 120, a first boosting circuit 131, a first CML to CMOS converter 141, a second boosting circuit 132, and a second CML to CMOS converter 142. The global driver 110 may receive the pair of clock signals CLK and CLKB. The pair of clock signals CLK and CLKB may include a clock signal CLK and a complementary clock signal CLKB. Each of the clock signal CLK and the complementary clock signal CLKB may have the CML level. The global driver 110 may receive the pair of clock signals CLK and CLKB to generate a pair of global clock signals GCLK and GCLKB. The pair of global clock signals GCLK and GCLKB may include a global clock signal GCLK and a complementary global clock signal GCLKB. The global driver 110 may be a CML driver, a CML buffer, or a CML amplifying circuit. The pair of global clock signals GCLK and GCLKB may have a CML level.

The clock transmission driver 120 may receive the pair of global clock signals GCLK and GCLKB from the global driver 110. The clock transmission driver 120 may amplify the pair of global clock signals GCLK and GCLKB to generate the pair of transmission clock signals TCLK and TCLKB. The clock transmission driver 120 may output the pair of transmission clock signals TCLK and TCLKB to the clock transmission lines 101 and 102. The pair of transmission clock signals TCLK and TCLKB may include a transmission clock signal TCLK and a complementary transmission clock signal TCLKB. The clock transmission driver 120 may be a nibble driver configured to amplify the pair of global clock signals GCLK and GCLKB in order to transmit the pair of global clock signals GCLK and GCLKB, which are generated by the global driver 110, to the clock transmission lines 101 and 102 coupled to the clock transmission driver 120 among a plurality of clock transmission lines. Although not illustrated, the clock distribution network 100 may further include a plurality of nibble drivers configured to transmit the pair of global clock signals GCLK and GCLKB to other clock transmission lines. The clock transmission driver 120 may be a CML driver, a CML buffer, or a CML amplifying circuit. Because the transmission clock signals TCLK and TCLKB are clock signals transmitted through the clock transmission lines 101 and 102 coupled between the clock transmission driver 120 and the first CML to CMOS converter 141, the transmission clock signals TCLK and TCLKB may be a pair of first transmission clock signals. The pair of first transmission clock signals may include a first transmission clock signal and a first complementary transmission clock signal.

The first boosting circuit 131 may be coupled to the clock transmission lines 101 and 102 to receive the pair of transmission clock signals TCLK and TCLKB. The first boosting circuit 131 may be coupled between the clock transmission driver 120 and the first CML to CMOS converter 141 or between the clock transmission driver 120 and the second boosting circuit 132. The first boosting circuit 131 may boost the voltage levels of the pair of transmission clock signals TCLK and TCLKB to generate a pair of first boosted clock signals BCLK1 and BCLK1B. The pair of first boosted clock signals BCLK1 and BCLK1B may include a first boosted clock signal BCLK1 and a first complementary boosted clock signal BCLK1B. The first boosting circuit 131 may amplify an alternating current (AC) component and/or a high frequency component of the pair of transmission clock signals TCLK and TCLKB to generate the pair of first boosted clock signals BCLK1 and BCLK1B having more improved AC gain than the pair of transmission clock signals TCLK and TCLKB. The AC gain may mean a high frequency gain that may occur at a relatively high frequency and may mean a gain that occurs when a voltage level of a signal transitions. The first boosting circuit 131 may boost the pair of transmission clock signals TCLK and TCLKB by forming AC peaking of the pair of first boosted clock signals BCLK1 and BCLK1B when logic levels of the pair of transmission clock signals TCLK and TCLKB transition.

The first CML to CMOS converter 141 may receive the pair of first boosted clock signals BCLK1 and BCLK1B. The first CML to CMOS converter 141 may shift the voltage levels of the pair of first boosted clock signals BCLK1 and BCLK1B to generate a pair of first local clock signals LCLK1 and LCLK1B. The first CML to CMOS converter 141 may be a first local driver configured to amplify the pair of first boosted clock signals BCLK1 and BCLK1B to generate the pair of first local clock signals LCLK1 and LCLK1B. The pair of first local clock signals LCLK1 and LCLK1B may include a first local clock signal LCLK1 and a first complementary local clock signal LCLK1B. The first CML to CMOS converter 141 may convert the pair of first boosted clock signals BCLK1 and BCLK1B having a CML level to the pair of first local clock signals LCLK1 and LCLK1B having a CMOS level. The pair of first local clock signals LCLK1 and LCLK1B may be provided to an internal circuit (not illustrated) coupled to the first CML to CMOS converter 141. The internal circuit coupled to the first CML to CMOS converter 141 may operate in synchronization with the pair of first local clock signals LCLK1 and LCLK1B. Due to a RC attenuation caused by a parasitic resistance (R) and a parasitic capacitance (C) of the clock transmission lines 101 and 102 from the clock transmission driver 120 to the first CML to CMOS converter 141, the amplitudes or the voltage levels of the pair of transmission clock signals TCLK and TCLKB may be attenuated when the pair of transmission clock signals TCLK and TCLKB reach the first CML to CMOS converter 141. The first boosting circuit 131 may compensate for the attenuation of the amplitudes or the voltage levels of the pair of transmission clock signals TCLK and TCLKB by boosting the pair of transmission clock signals TCLK and TCLKB transferred to the first CML to CMOS converter 141. Also, the first boosting circuit 131 may maintain the swing range of the pair of transmission clock signals TCLK and TCLKB and may minimize a delay time taken for the pair of transmission clock signals TCLK and TCLKB to reach the first CML to CMOS converter 141. Therefore, the first CML to CMOS converter 141 may normally generate the pair of first local clock signals LCLK1 and LCLK1B having voltage levels corresponding to the pair of transmission clock signals TCLK and TCLKB.

The second boosting circuit 132 may be coupled to the clock transmission lines 101 and 102 to receive the pair of transmission clock signals TCLK and TCLKB. The second boosting circuit 132 may be coupled between the first boosting circuit 131 and the second CML to CMOS converter 142. The second boosting circuit 132 may boost the voltage levels of the pair of first boosted clock signals BCLK1 and BCLK1B to generate a pair of second boosted clock signals BCLK2 and BCLK2B. The pair of second boosted clock signals BCLK2 and BCLK2B may include a second boosted clock signal BCLK2 and a second complementary boosted clock signal BCLK2B. The second boosting circuit 132 may amplify an AC component and/or a high frequency component of the pair of first boosted clock signals BCLK1 and BCLK1B to generate the pair of second boosted clock signals BCLK2 and BCLK2B having an improved AC gain over the pair of first boosted clock signals BCLK1 and BCLK1B. The second boosting circuit 132 may boost the pair of first boosted clock signals BCLK1 and BCLK1B by forming AC peaking of the pair of second boosted clock signals BCLK2 and BCLK2B when logic levels of the pair of first boosted clock signals BCLK1 and BCLK1B transition. Because the pair of second boosted clock signals BCLK2 and BCLK2B are clock signals transmitted through the clock transmission lines 101 and 102 coupled between the first CML to CMOS converter 141 and the second CML to CMOS converter 142, the pair of second boosted clock signals BCLK2 and BCLK2B may be a pair of second transmission clock signals. The second boosted clock signal BCLK2 may be a second transmission clock signal and the second complementary boosted clock signal BCLK2B may be a second complementary transmission clock signal. In an embodiment, the first boosting circuit 131 may be selectively provided to minimize a time difference between a time when the first CML to CMOS converter 141 receives the pair of transmission clock signals TCLK and TCLKB and a time when the second CML to CMOS converter 142 receives the pair of transmission clock signals TCLK and TCLKB. When the first boosting circuit 131 is not present, the second boosting circuit 132 may be coupled between the clock transmission driver 120 and the second CML to CMOS converter 142 and may receive the pair of transmission clock signals TCLK and TCLKB to boost the pair of transmission clock signals TCLK and TCLKB.

The second CML to CMOS converter 142 may receive the pair of second boosted clock signals BCLK2 and BCLK2B. The second CML to CMOS converter 142 may shift the voltage levels of the pair of second boosted clock signals BCLK2 and BCLK2B to generate a pair of second local clock signals LCLK2 and LCLK2B. The second CML to CMOS converter 142 may be a second local driver configured to amplify the pair of second boosted clock signals BCLK2 and BCLK2B to generate the pair of second local clock signals LCLK2 and LCLK2B. The pair of second local clock signals LCLK2 and LCLK2B may include a second local clock signal LCLK2 and a second complementary local clock signal LCLK2B. The second CML to CMOS converter 142 may convert the pair of second boosted clock signals BCLK2 and BCLK2B having a CML level to the pair of second local clock signals LCLK2 and LCLK2B having a CMOS level. The pair of second local clock signals LCLK2 and LCLK2B may be provided to an internal circuit (not illustrated) coupled to the second CML to CMOS converter 142. The internal circuit coupled to the second CML to CMOS converter 142 may operate in synchronization with the pair of second local clock signals LCLK2 and LCLK2B. Due to an RC attenuation caused by a parasitic resistance (R) and a parasitic capacitance (C) of the clock transmission lines 101 and 102 from the first boosting circuit 131 or the first CML to CMOS converter 141 to the second CML to CMOS converter 142, the amplitudes or the voltage levels of the pair of first boosted clock signals BCLK1 and BCLK1B, which are boosted by the first boosting circuit 131, may be attenuated when the pair of first boosted clock signals BCLK1 and BCLK1B reach the second CML to CMOS converter 142. The second boosting circuit 132 may compensate for the attenuation of the amplitudes or the voltage levels of the pair of first boosted clock signals BCLK1 and BCLK1B by boosting the pair of first boosted clock signals BCLK1 and BCLK1B transferred to the second CML to CMOS converter 142. Also, the second boosting circuit 132 may maintain the swing range of the pair of first boosted clock signals BCLK1 and BCLK1B and may minimize delay time taken for the pair of first boosted clock signals BCLK1 and BCLK1B to reach the second CML to CMOS converter 142. Therefore, the second CML to CMOS converter 142 may normally generate the pair of second local clock signals LCLK2 and LCLK2B having voltage levels corresponding to the pair of transmission clock signals TCLK and TCLKB, and a difference between an amount of time taken for the pair of transmission clock signals TCLK and TCLKB to reach the first CML to CMOS converter 141 and an amount of time taken for the pair of transmission clock signals TCLK and TCLKB to reach the second CML to CMOS converter 142 may be minimized.

Figure 2:
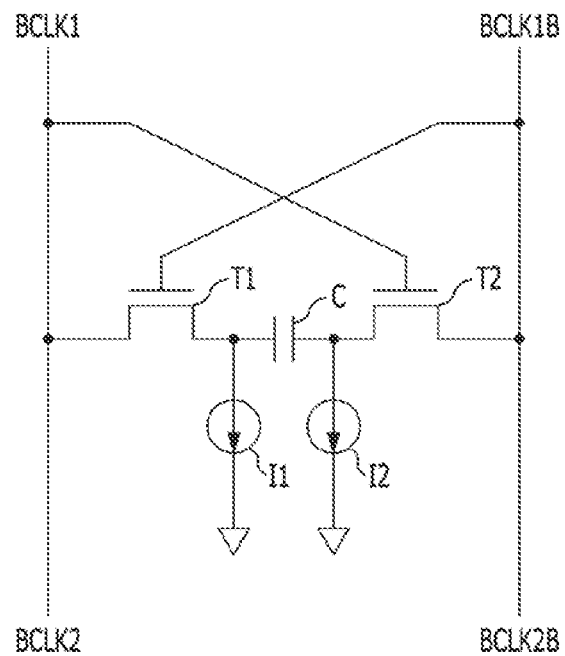
FIG. 2 is a diagram illustrating a configuration of a boosting circuit illustrated in FIG. 1.

FIG. 2 is a diagram illustrating a configuration of a boosting circuit illustrated in FIG. 1. FIG. 2 illustrates a configuration of the second boosting circuit 132. Referring to FIG. 2, the second boosting circuit 132 may receive the first boosted clock signal BCLK1 and the first complementary boosted clock signal BCLK1B to output the second boosted clock signal BCLK2 and the second complementary boosted clock signal BCLK2B. The second boosting circuit 132 may increase the amplitude of the first complementary boosted clock signal BCLK1B when the voltage level of the first boosted clock signal BCLK1 transitions. The second boosting circuit 132 may increase the amplitude of the first boosted clock signal BCLK1 when the voltage level of the first complementary boosted clock signal BCLK1B transitions. The second boosting circuit 132 may include a first transistor T1, a second transistor T2, a first current source I1, and a second current source I2. Each of the first transistor T1 and the second transistor T2 may be an N-channel MOS transistor. The first transistor T1 may receive the first complementary boosted clock signal BCLK1B at its gate. One between a drain and a source of the first transistor T1 may be coupled to a node to which the first boosted clock signal BCLK1 is input and a node from which the second boosted clock signal BCLK2 is output. The second transistor T2 may receive the first boosted clock signal BCLK1 at its gate. One between a drain and a source of the second transistor T2 may be coupled to a node to which the first complementary boosted clock signal BCLK1B is input and a node from which the second complementary boosted clock signal BCLK2B is output. The first current source I1 may be coupled between a ground voltage node and the other one between the drain and the source of the first transistor T1. The second current source I2 may be coupled to the ground voltage node and the other one between the drain and the source of the second transistor T2. An amount of current flowing through the first current source I1 may be the same as or different from an amount of current flowing through the second current source I2. The second boosting circuit 132 may further include a capacitor C. The capacitor C may be coupled between the other one between the drain and the source of the first transistor T1 and the other one between the drain and the source of the second transistor T2. The first boosting circuit 131 may have the same configuration as the second boosting circuit 132 except that the first boosting circuit 131 receives the transmission clock signal TCLK and the complementary transmission clock signal TCLKB to output the first boosted clock signal BCLK1 and the first complementary boosted clock signal BCLK1B.

The second boosting circuit 132 may operate as follows. When the first boosted clock signal BCLK1 transitions from a logic low level to a logic high level, the first complementary boosted clock signal BCLK1B may transition from a logic high level to a logic low level and the second transistor T2 may be turned on. When the second transistor T2 is turned on, current may flow from the node, from which the second complementary boosted clock signal BCLK2B is output, to the ground voltage node through the second current source I2. Therefore, the second complementary boosted clock signal BCLK2B may be additionally driven to a logic low level and the amplitude and the voltage level of the second complementary boosted clock signal BCLK2B may be boosted. When the first complementary boosted clock signal BCLK1B transitions from a logic low level to a logic high level, the first boosted clock signal BCLK1 may transition from a logic high level to a logic low level and the first transistor T1 may be turned on. When the first transistor T1 is turned on, current may flow from the node, from which the second boosted clock signal BCLK2 is output, to the ground voltage node through the first current source I1. Therefore, the second boosted clock signal BCLK2 may be additionally driven to a logic low level and the amplitude and the voltage level of the second boosted clock signal BCLK2 may be boosted. Whenever each of the first boosted clock signal BCLK1 and the first complementary boosted clock signal BCLK1B transitions, the second boosting circuit 132 may boost the voltage levels of the pair of first boosted clock signals BCLK1 and BCLK1B by forming the AC peaking of each of the second boosted clock signal BCLK2 and the second complementary boosted clock signal BCLK2B. When the AC peaking is formed, the amplitudes of the pair of second boosted clock signals BCLK2 and BCLK2B may increase, and besides, phases of rising and falling edges of the pair of second boosted clock signals BCLK2 and BCLK2B may advance. Therefore, a phase difference between the pair of first boosted clock signals BCLK1 and BCLK1B and the pair of second boosted clock signals BCLK2 and BCLK2B may be reduced.

Figure 3:
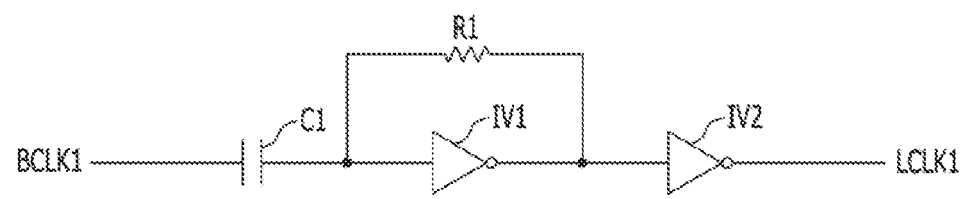
FIG. 3 is a diagram illustrating a configuration of a CML to CMOS driver illustrated in FIG. 1.
Figure 3:
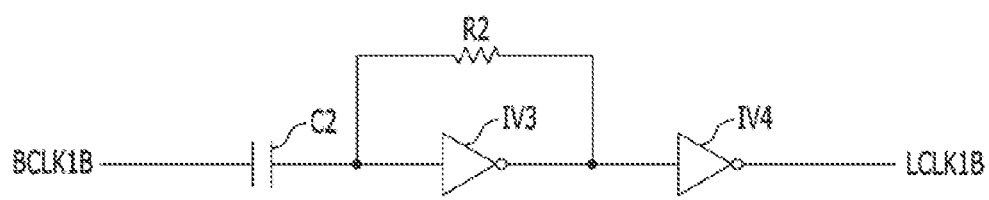

FIG. 3 is a diagram illustrating a configuration of a CML to CMOS driver illustrated in FIG. 1. FIG. 3 illustrates the configuration of the first CML to CMOS converter 141. Referring to FIG. 3, the first CML to CMOS converter 141 may include a first capacitor C1, a first inverter IV1, a first resistor R1, a second inverter IV2, a second capacitor C2, a third inverter IV3, a second resistor R2, and a fourth inverter IV4. The first capacitor C1 may receive the first boosted clock signal BCLK1 at one end and may be coupled to an input node of the first inverter IV1 at the other end. The first capacitor C1 may output the AC component and/or a high frequency component of the first boosted clock signal BCLK1. When the logic level of the first boosted clock signal BCLK1 transitions, the first inverter IV1 may operate based on the output of the first capacitor C1. The first inverter IV1 may inversely amplify the signal input through the input node to output the inversely amplified signal through the output node. The first resistor R1 may be coupled between the input and output nodes of the first inverter IV1. The first resistor R1 may set the voltage level of the input node of the first inverter IV1. For example, when the first inverter IV1 operates between the power voltage and the ground voltage, the first resistor R1 may set the voltage level of the input node of the first inverter IV1 to a voltage level corresponding to half of the power voltage. Under the situation that the direct current (DC) component and/or the low frequency component of the first boosted clock signal BCLK1 are removed by the first capacitor C1, the first resistor R1 may set the voltage level of the input node of the first inverter IV1 to a voltage level corresponding to half of the operating voltage of the first inverter IV1 to control the first inverter IV1 to linearly operate. The second inverter IV2 may be coupled to the output node of the first inverter IV1 at its input node. The second inverter IV2 may inversely drive the output of the first inverter IV1 to output the inversely driven signal, as the first local clock signal LCLK1, through the output node.

The second capacitor C2 may receive the first complementary boosted clock signal BCLK1B at one end and may be coupled to an input node of the third inverter IV3 at the other end. The second capacitor C2 may output the AC component and/or a high frequency component of the first complementary boosted clock signal BCLK1B. When the logic level of the first complementary boosted clock signal BCLK1B transitions, the third inverter IV3 may operate based on the output of the second capacitor C2. The third inverter IV3 may inversely amplify the signal input through the input node to output the inversely amplified signal through the output node. The second resistor R2 may be coupled between the input and output nodes of the third inverter IV3. The second resistor R2 may set the voltage level of the input node of the third inverter IV3. The second resistor R2 may set the voltage level of the input node of the third inverter IV3 to a voltage level corresponding to half of the power voltage. Under the situation that the DC component and/or the low frequency component of the first complementary boosted clock signal BCLK1B are removed by the second capacitor C2, the second resistor R2 may set the voltage level of the input node of the third inverter IV3 to a voltage level corresponding to half of the operating voltage of the third inverter IV3 to control the third inverter IV3 to linearly operate. The fourth inverter IV4 may be coupled to the output node of the third inverter IV3 at its input node. The fourth inverter IV4 may inversely drive the output of the third inverter IV3 to output the inversely driven signal, as the first complementary local clock signal LCLK1B, through the output node. In some embodiments, the configuration of the second CML to CMOS converter 142 is similar to the configuration of the first CML to CMOS converter 141 illustrated in FIG. 3 and described above.

Figure 4:
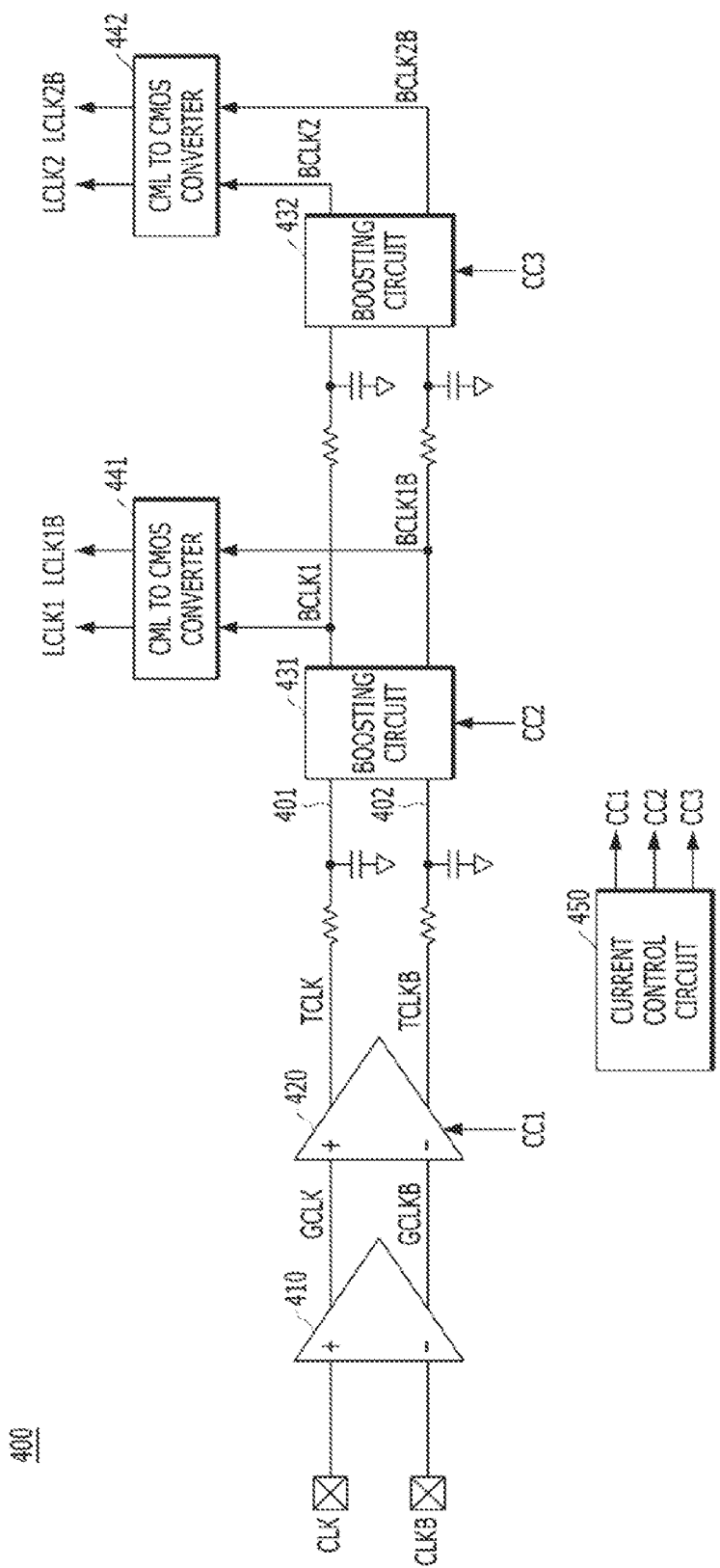
FIG. 4 is a diagram illustrating a configuration of a clock distribution network in accordance with an embodiment.

FIG. 4 is a diagram illustrating a configuration of a clock distribution network 400 in accordance with an embodiment. The clock distribution network 400 illustrated in FIG. 4 may include a majority of the same elements as the clock distribution network 100 illustrated in FIG. 1. Hereinafter, mostly described will be elements different from the clock distribution network 100 without the same elements as the clock distribution network 100. The clock distribution network 400 may include a global driver 410, a clock transmission driver 420, a first boosting circuit 431, a first CML to CMOS converter 441, a second boosting circuit 432, and a second CML to CMOS converter 442. The global driver 410, the first CML to CMOS converter 441, and the second CML to CMOS converter 442 may be substantially the same as the global driver 110, the first CML to CMOS converter 141, and the second CML to CMOS converter 142 illustrated in FIG. 1. The global driver 410 may receive the pair of clock signals CLK and CLKB to generate the pair of global clock signals GCLK and GCLKB. The clock transmission driver 420 may amplify the pair of global clock signals GCLK and GCLKB to generate the pair of transmission clock signals TCLK and TCLKB. The first boosting circuit 431 may boost the voltage levels of the pair of transmission clock signals TCLK and TCLKB to generate the pair of first boosted clock signals BCLK1 and BCLK1B. The first CML to CMOS converter 441 may shift the voltage levels of the pair of first boosted clock signals BCLK1 and BCLK1B to generate the pair of first local clock signals LCLK1 and LCLK1B. The second boosting circuit 432 may boost the voltage levels of the pair of first boosted clock signals BCLK1 and BCLK1B to generate the pair of second boosted clock signals BCLK2 and BCLK2B. The second CML to CMOS converter 442 may shift the voltage levels of the pair of second boosted clock signals BCLK2 and BCLK2B to generate the pair of second local clock signals LCLK2 and LCLK2B.

The clock transmission driver 420 may be a CML driver and may further receive a first current control signal CC1. The first current control signal CC1 may control a gain and/or a current consumption amount of the clock transmission driver 420. The current consumption amount of the clock transmission driver 420 may mean the driving force of the clock transmission driver 420. The clock transmission driver 420 may have the gain and/or the current consumption amount that can vary based on the first current control signal CC1. For example, the gain that can vary based on the first current control signal CC1 may be a whole gain including an AC gain and a DC gain. Because the clock distribution network 400 includes the first boosting circuit 431 and the second boosting circuit 432 on the clock transmission lines 401 and 402, unnecessary current may be consumed when the clock transmission driver 420 maximizes the driving force for generating the pair of transmission clock signals TCLK and TCLKB. Therefore, the gain and/or the current consumption amount of the clock transmission driver 420 may be adjusted on the basis of the first current control signal CC1 to optimize the driving force of the clock transmission driver 420 to generate the pair of transmission clock signals TCLK and TCLKB. The first boosting circuit 431 may further receive a second current control signal CC2. The second current control signal CC2 may control an AC gain and/or a current consumption amount of the first boosting circuit 431. The first boosting circuit 431 may have the AC gain and/or the current consumption amount that can vary based on the second current control signal CC2. The second boosting circuit 432 may further receive a third current control signal CC3. The third current control signal CC3 may control an AC gain and/or a current consumption amount of the second boosting circuit 432. The second boosting circuit 432 may have the AC gain and/or the current consumption amount that can vary based on the third current control signal CC3. For example, each of the first current source I1 and the second current source I2 illustrated in FIG. 2 may include a variable current source. Based on the third current control signal CC3, an amount of current flowing through each of the first current source I1 and the second current source I2 may vary.

The clock distribution network 400 may further include a current control circuit 450. The current control circuit 450 may generate the first current control signal CC1, the second current control signal CC2, and the third current control signal CC3 in order to minimize the skew or the variability between the pair of first local clock signals LCLK1 and LCLK1B and the pair of second local clock signals LCLK2 and LCLK2B and optimize the current consumed in the clock distribution network 400. Each of the first current control signal CC1, the second current control signal CC2, and the third current control signal CC3 may be a digital signal having multiple bits or may be an analogue signal having various voltage levels.

Figure 5:
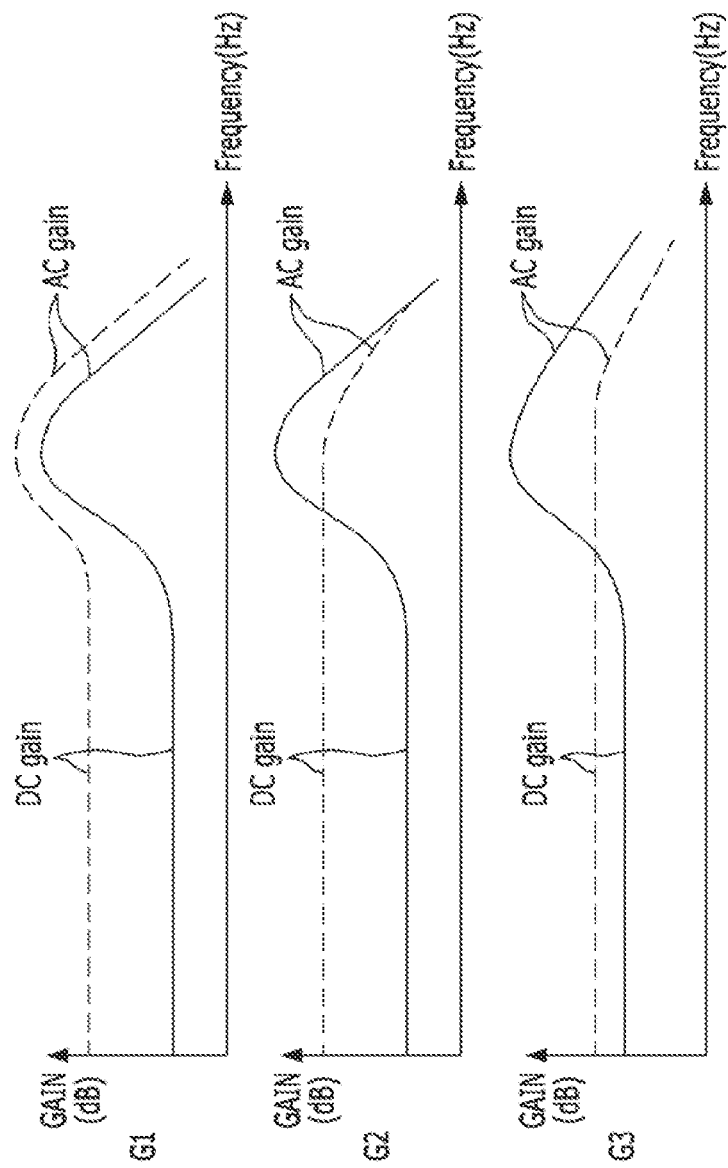
FIG. 5 is a diagram illustrating gain comparison of a pair of clock signals transferred through a clock transmission line between when a boosting circuit is provided and when the boosting circuit is not provided.

FIG. 5 is a diagram illustrating gain comparison of a pair of clock signals transferred through a clock transmission line between when a boosting circuit is provided and when the boosting circuit is not provided. Referring to FIGS. 4 and 5, the graph "G1" may indicate the gain of the pair of transmission clock signals TCLK and TCLKB output from the clock transmission driver 420. In the graph "G1", a solid line may indicate the gain of the pair of clock signals output from the clock transmission driver 420 when the gain and the driving force of the clock transmission driver 420 are controlled and a dotted line may indicate the gain of the pair of clock signals output from the clock transmission driver when the gain and the driving force of the clock transmission driver 420 are not controlled. The graph "G2" may indicate the gain of the pair of clock signals input to the first CML to CMOS converter 441, and the graph "G3" may indicate the gain of the pair of clock signals input to the second CML to CMOS converter 442. In the graphs "G2" and "G3", solid lines may indicate the gains of the pair of clock signals when the boosting circuit is provided and dotted lines may indicate the gains of the pair of clock signals when the boosting circuit is not provided. The whole gain and the current consumption amount of the clock transmission driver may be optimized on the basis of the first current control signal CC1. As shown in the graph "G1", as compared to when the gain and the driving force of the clock transmission driver are not controlled, the clock transmission driver may have the DC gain and/or the low frequency gain ("DC gain") and the AC gain and/or the high frequency gain ("AC gain"), which are relatively small when the gain and the driving force of the clock transmission driver are controlled. Therefore, the pair of clock signals output from the clock transmission driver 420, of which the gain and the driving force are not controlled, may have a DC gain ("DC gain") and an AC gain ("AC gain") that are greater than a DC gain ("DC gain") and an AC gain ("AC gain") of the pair of clock signals output from the clock transmission driver 420, of which the gain and the driving force are controlled.

When the boosting circuit 431 is not provided, the DC gain ("DC gain") and the AC gain ("AC gain") of the pair of clock signals input to the first CML to CMOS converter 441 may be decreased due to the RC attenuation of the clock transmission lines 401 and 402 even though the pair of clock signals output from the clock transmission driver have a relatively great DC gain ("DC gain") and AC gain ("AC gain"). On the contrary, when the boosting circuit 431 is provided, the RC attenuation of the clock transmission lines 401 and 402 may be compensated for. Therefore, as shown in the graph "G2", even though the DC gain ("DC gain") of the pair of clock signals input to the first CML to CMOS converter 441 when the boosting circuit 431 is provided is smaller than the DC gain ("DC gain") of the pair of clock signals input to the first CML to CMOS converter 441 when the boosting circuit 431 is not provided, the AC gain ("AC gain") of the pair of clock signals input to the first CML to CMOS converter 441 when the boosting circuit 431 is provided is greater than the AC gain ("AC gain") of the pair of clock signals input to the first CML to CMOS converter 441 when the boosting circuit 431 is not provided. Due to the RC attenuation of the clock transmission lines 401 and 402, the DC gain and the AC gain of the pair of clock signals input to the second CML to CMOS converter 442 may be further attenuated. When the boosting circuit 432 is provided, the DC gain ("DC gain") and the AC gain ("AC gain") of the pair of clock signals input to the second CML to CMOS converter 442 may be maintained by compensating for the RC attenuation of the clock transmission lines 401 and 402. Therefore, as shown in the graph "G3", the DC gain ("DC gain") of the pair of clock signals input to the second CML to CMOS converter 442 when the boosting circuit 432 is not provided is similar to the DC gain ("DC gain") of the pair of clock signals input to the second CML to CMOS converter 442 when the boosting circuit 432 is provided while the AC gain ("AC gain") of the pair of clock signals input to the second CML to CMOS converter 442 when the boosting circuit 432 is not provided is much smaller than the AC gain ("AC gain") of the pair of clock signals input to the second CML to CMOS converter 442 when the boosting circuit 432 is provided. Because each of the first boosting circuit 431 and the second boosting circuit 432 can increase a target frequency gain, i.e., the high frequency gain, the first boosting circuit 431 and the second boosting circuit 432 may effectively amplify the pair of clock signals transferred through the clock transmission lines. Also, the first boosting circuit 431 and the second boosting circuit 432 may optimize the power consumption for transferring a clock signal from the clock transmission driver to each internal circuit through the clock transmission lines.

Figure 6:
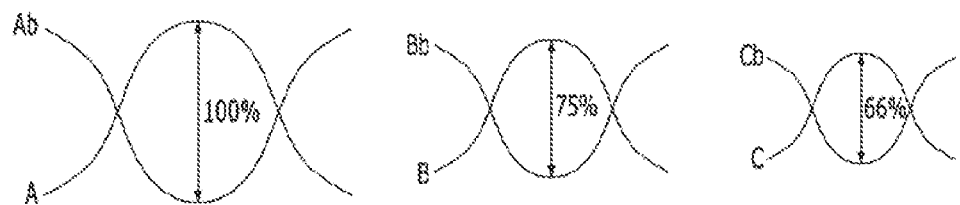
FIG. 6 is a diagram relatively illustrating amplitudes of a pair of clock signals transferred through a clock transmission line when a boosting circuit is provided and when the boosting circuit is not provided.
Figure 6:
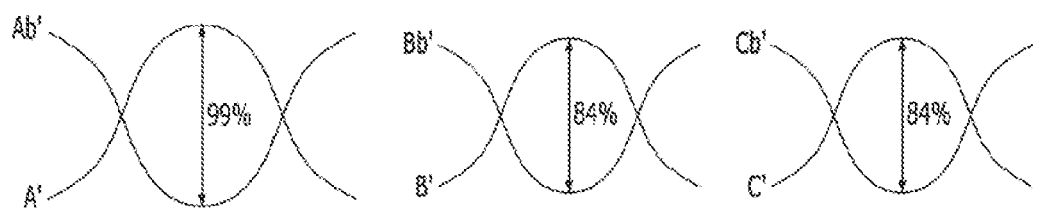

FIG. 6 is a diagram relatively illustrating amplitudes of a pair of clock signals transferred through a clock transmission line when boosting circuits are provided and when no boosting circuits are provided. Referring to FIGS. 4 and 6, "A" and "Ab" indicate the amplitudes of the pair of clock signals output from the clock transmission driver 420 when the gain and the driving force of the clock transmission driver 420 are not controlled, "B" and "Bb" indicate the amplitudes of the pair of clock signals input to the first CML to CMOS converter 441 when no boosting circuits are provided, and "C" and "Cb" indicate the amplitudes of the pair of clock signals input to the second CML to CMOS converter 442 when no boosting circuits are provided. "A'" and "Ab'" indicate the amplitudes of the pair of clock signals output from the clock transmission driver 420 when the whole 1o gain and the driving force of the clock transmission driver 420 are controlled, "B'" and "Bb'" indicate the amplitudes of the pair of clock signals input to the first CML to CMOS converter 441 when the first boosting circuit 431 is provided, and "C'" and "Cb'" indicate the amplitudes of the pair of clock signals input to the second CML to CMOS converter 442 when the boosting circuit 432 is provided.

When "A" and "Ab" indicate the amplitudes corresponding to 100% of a reference value, "A'" and "Ab'" indicate the amplitudes corresponding to about 99% of the reference value. "B" and "Bb" indicate decreased amplitudes corresponding to 75% of the reference value due to the RC attenuation of the clock transmission lines 401 and 402 while "B'" and "Bb'" indicate the amplitudes, which are boosted by the boosting circuit and correspond to about 84% of the reference value. "C" and "Cb" indicate decreased amplitudes corresponding to 66% of the reference value due to the RC attenuation of the clock transmission lines 401 and 402 while "C'" and "Cb'" indicate the amplitudes, which are boosted by the boosting circuit and correspond to about 84% of the reference value. The amplitudes indicated by "B'" and "Bb'" are maintained similar to the amplitudes indicated by "C'" and "Cb'". Therefore, the amplitudes of the pair of clock signals may be attenuated as the pair of clock signals travels farther through the clock transmission lines 401 and 402 when the boosting circuit is not provided while the amplitudes of the pair of clock signals may be maintained to a particular level even though the pair of clock signals travels farther through the clock transmission lines 401 and 402 when the boosting circuit is provided.

Figure 7:
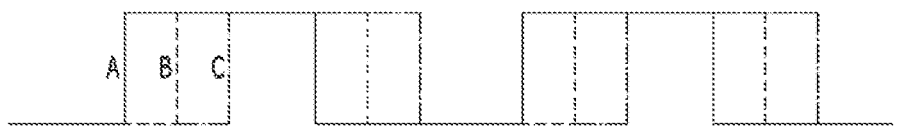
FIG. 7 is a diagram illustrating phase differences of a pair of clock signals transferred through a clock transmission line when a boosting circuit is provided and when the boosting circuit is not provided.
Figure 7:

FIG. 7 is a diagram illustrating phase differences of a pair of clock signals transferred through a clock transmission line when a boosting circuit is provided and when a boosting circuit is not provided. Referring to FIGS. 4 and 7, "A" and "A'" shown as solid lines indicate the pair of clock signals output from the clock transmission driver 420, "B" and "B'" shown as dotted lines indicate the pair of clock signals input to the first CML to CMOS converter 441, and "C" and "C'" shown as alternating long and short dash lines indicate the pair of clock signals input to the second CML to CMOS converter 442. When the first boosting circuit 431 and the second boosting circuit 432 are not provided, phase differences between "A" and "B" and between "B" and "C" may be relatively great due to the RC attenuation of the clock transmission lines 401 and 402. As the phase difference between "B" and "C" becomes greater, the difference between the operating timings of the internal circuits using "B" and "C" may become greater and the skews of local clock signals generated from "B" and "C" may become greater. Especially, when the internal circuits are configured to receive and output data, the skews and the variabilities among input/output pins may become greater. When the first boosting circuit 431 and the second boosting circuit 432 are provided, "B'" may be generated through the boosting of "A'", and "C'" may be generated through the boosting of "B'". Therefore, the phase difference between "A'" and "B'" may become smaller than the phase difference between "A" and "B", and the phase difference between "B'" and "C'" may become smaller than the phase difference between "B" and "C". Accordingly, the timing difference between when the pair of transmission clock signals TCLK and TCLKB generated by the clock transmission driver 420 may be minimized before being input to corresponding internal circuits. Further, when the internal circuits are configured to receive and output data, the skews and the variabilities among input/output pins may be minimized.

Figure 8:
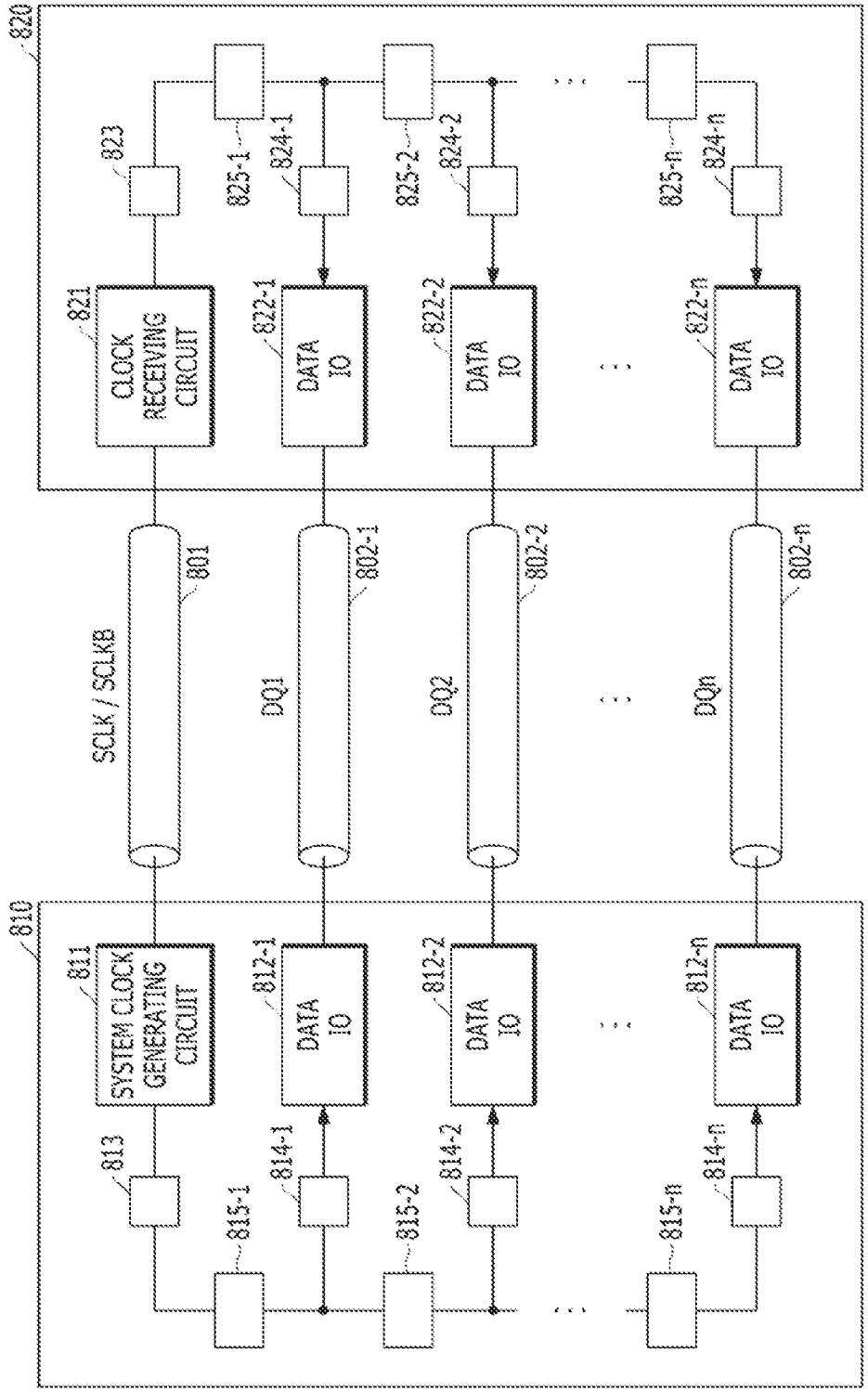
FIG. 8 is a diagram illustrating a configuration of a semiconductor system in accordance with an embodiment.

FIG. 8 is a diagram illustrating a configuration of a semiconductor system 8 in accordance with an embodiment. Referring to FIG. 8, the semiconductor system 8 may include a first semiconductor apparatus 810 and a second semiconductor apparatus 820. The first semiconductor apparatus 810 may provide various control signals required for the second semiconductor apparatus 820 to operate. The first semiconductor apparatus 810 may include various kinds of apparatuses. For example, the first semiconductor apparatus 810 may be a host device such as a central processing unit (CPU), a graphic processing unit (GPU), a multi-media processor (MMP), a digital signal processor, an application processor (AP) and a memory controller. For example, the second semiconductor apparatus 820 may be a memory device, and the memory device may include a volatile memory and/or a non-volatile memory. The volatile memory may include static random access memory (static RAM: SRAM), dynamic RAM (DRAM), and synchronous DRAM (SDRAM). The non-volatile memory may include read only memory (ROM), programmable ROM (PROM), electrically erasable and programmable ROM (EEPROM), electrically programmable ROM (EPROM), flash memory, phase change RAM (PRAM), magnetic RAM (MRAM), resistive RAM (RRAM), ferroelectric RAM (FRAM), and so forth.

The second semiconductor apparatus 820 may be coupled to the first semiconductor apparatus 810 through a plurality of buses. The plurality of buses may be a signal transmission path, a link or a channel for transferring a signal. The plurality of buses may include a clock bus 801 and 'n' number of data buses 802-1, 802-2, . . . , and 802-n. 'n' may be an integer equal to or greater than 3. The clock bus 801 may be a one-way bus and each of the 'n' number of data buses 802-1, 802-2, . . . , and 802-n may be a two-way bus. The second semiconductor apparatus 820 may be coupled to the first semiconductor apparatus 810 through the clock bus 801. The second semiconductor apparatus 820 may receive a system clock signal SCLK through the clock bus 801. The clock bus 801 may transfer the system clock signal SCLK as a single-ended signal and may transfer the system clock signal SCLK together with a complementary system clock signal SCLKB as a pair of system clock signals SCLK and SCLKB of differential signals. Although not illustrated, the second semiconductor apparatus 820 may be coupled to the first semiconductor apparatus 810 through a command-address bus and may receive a command-address signal from the first semiconductor apparatus 810 through the command-address bus. The second semiconductor apparatus 820 may be coupled to the first semiconductor apparatus 810 through another clock bus and may receive a clock signal other than the system clock signal SCLK from the first semiconductor apparatus 810 through the another clock bus. The second semiconductor apparatus 820 may be coupled to the first semiconductor apparatus 810 through the first data bus 802-1. Through the first data bus 802-1, the second semiconductor apparatus 820 may receive or provide first data DQ1 from or to the first semiconductor apparatus 810. The second semiconductor apparatus 820 may be coupled to the first semiconductor apparatus 810 through the second data bus 802-2. Through the second data bus 802-2, the second semiconductor apparatus 820 may receive or provide second data DQ2 from or to the first semiconductor apparatus 810. The second semiconductor apparatus 820 may be coupled to the first semiconductor apparatus 810 through the n-th data bus 802-n. Through the n-th data bus 802-n, the second semiconductor apparatus 820 may receive or provide n-th data DQn from or to the first semiconductor apparatus 810.

The first semiconductor apparatus 810 may include a system clock generating circuit 811, a first data input/output circuit (DATA IO) 812-1, a second data input/output circuit (DATA IO) 812-2 and a n-th data input/output circuit (DATA IO) 812-n. The system clock generating circuit 811 may generate the system clock signal SCLK and the complementary system clock signal SCLKB. The system clock generating circuit 811 may include an oscillator or a phase locked loop circuit configured to generate the pair of system clock signals SCLK and SCLKB. The first data input/output circuit 812-1 may be coupled to the first data bus 802-1. Through the first data bus 802-1, the first data input/output circuit 812-1 may provide the first data DQ1 to the second semiconductor apparatus 820 and may receive the first data DQ1 provided from the second semiconductor apparatus 820. The second data input/output circuit 812-2 may be coupled to the second data bus 802-2. Through the second data bus 802-2, the second data input/output circuit 812-2 may provide the second data DQ2 to the second semiconductor apparatus 820 and may receive the second data DQ2 provided from the second semiconductor apparatus 820. The n-th data input/output circuit 812-n may be coupled to the n-th data bus 802-n. Through the n-th data bus 802-n, the n-th data input/output circuit 812-n may provide the n-th data DQn to the second semiconductor apparatus 820 and may receive the n-th data DQn provided from the second semiconductor apparatus 820.

By adopting at least one between the clock distribution networks 100 and 400 illustrated in FIGS. 1 and 4, the first semiconductor apparatus 810 may provide the pair of system clock signals SCLK and SCLKB to the first to n-th data input/output circuits 812-1 and 812-n. The first semiconductor apparatus 810 may include a clock transmission driver 813, a first local driver 814-1, a second local driver 814-2, and n-th local driver 814-n. The clock transmission driver 813 may amplify the pair of system clock signals SCLK and SCLKB, which are generated from the system clock generating circuit 811, and may output the amplified pair of system clock signals SCLK and SCLKB as a pair of transmission clock signals. The first local driver 814-1 may convert a pair of transmission clock signals having a CML level to a pair of clock signal having a CMOS level and may provide the converted pair of clock signals to the first data input/output circuit 812-1. The first data input/output circuit 812-1 may perform operations of receiving and providing the first data DQ1 in synchronization with the converted pair of clock signals. The second local driver 814-2 may convert a pair of transmission clock signals having a CML level to a pair of clock signal having a CMOS level and may provide the converted pair of clock signals to the second data input/output circuit 812-2. The second data input/output circuit 812-2 may perform operations of receiving and providing the second data DQ2 in synchronization with the converted pair of clock signals. The n-th local driver 814-n may convert a pair of transmission clock signals having a CML level to a pair of clock signal having a CMOS level and may provide the converted pair of clock signals to the n-th data input/output circuit 812-n. The n-th data input/output circuit 812-n may perform operations of receiving and providing the n-th data DQn in synchronization with the converted pair of clock signals. Each of the first local driver 814-1, the second local driver 814-2, and the n-th local driver 814-n may include a CML to CMOS converter.

The first semiconductor apparatus 810 may further include a first boosting circuit 815-1, a second boosting circuit 815-2, and a n-th boosting circuit 815-n. The first boosting circuit 815-1 may be coupled between the clock transmission driver 813 and the first local driver 814-1 and the second boosting circuit 815-2 and may boost the pair of clock signals output from the clock transmission driver 813. The second boosting circuit 815-2 may be coupled between the first boosting circuit 815-1 and the second local driver 814-2 and may boost the pair of clock signals output from the first boosting circuit 815-1. The n-th boosting circuit 815-n may be coupled between the boosting circuit of a previous stage and the n-th local driver 814-n and may boost the pair of clock signals to be provided to the n-th local driver 814-n.

The second semiconductor apparatus 820 may include a clock receiving circuit 821, a first data input/output circuit (DATA IO) 822-1, a second data input/output circuit (DATA IO) 822-2, and a n-th data input/output circuit (DATA IO) 822-n. The clock receiving circuit 821 may be coupled to the clock bus 801 and may receive the system clock signal SCLK or the pair of system clock signals SCLK and SCLKB to generate a pair of global clock signals. In an embodiment, the clock receiving circuit 821 may divide the frequencies of the pair of system clock signals SCLK and SCLKB to generate the pair of global clock signals having lower frequencies than the pair of system clock signals SCLK and SCLKB. The first data input/output circuit 822-1 may be coupled to the first data bus 802-1. Through the first data bus 802-1, the first data input/output circuit 822-1 may provide the first data DQ1 to the first semiconductor apparatus 810 and may receive the first data DQ1 provided from the first semiconductor apparatus 810. The second data input/output circuit 822-2 may be coupled to the second data bus 802-2. Through the second data bus 802-2, the second data input/output circuit 822-2 may provide the second data DQ2 to the first semiconductor apparatus 810 and may receive the second data DQ2 provided from the first semiconductor apparatus 810. The n-th data input/output circuit 822-n may be coupled to the n-th data bus 802-n. Through the n-th data bus 802-n, the n-th data input/output circuit 822-n may provide the n-th data DQn to the first semiconductor apparatus 810 and may receive the n-th data DQn provided from the first semiconductor apparatus 810.

By adopting at least one between the clock distribution networks 100 and 400 illustrated in FIGS. 1 and 4, the second semiconductor apparatus 820 may provide the pair of global clock signals to the first to n-th data input/output circuits 822-1 and 822-n. The second semiconductor apparatus 820 may include a clock transmission driver 823, a first local driver 824-1, a second local driver 824-2, and n-th local driver 824-n. The clock transmission driver 823 may amplify the pair of global clock signals, which are generated from the clock receiving circuit 821, and may output the amplified pair of global clock signals as a pair of transmission clock signals. The first local driver 824-1 may convert a pair of transmission clock signals having a CML level to a pair of clock signal having a CMOS level and may provide the converted pair of clock signals to the first data input/output circuit 822-1. The first data input/output circuit 822-1 may perform operations of receiving and providing the first data DQ1 in synchronization with the converted pair of clock signals. The second local driver 824-2 may convert a pair of transmission clock signals having a CML level to a pair of clock signal having a CMOS level and may provide the converted pair of clock signals to the second data input/output circuit 822-2. The second data input/output circuit 822-2 may perform operations of receiving and providing the second data DQ2 in synchronization with the converted pair of clock signals. The n-th local driver 824-n may convert a pair of transmission clock signals having a CML level to a pair of clock signal having a CMOS level and may provide the converted pair of clock signals to the n-th data input/output circuit 822-n. The n-th data input/output circuit 822-n may perform operations of receiving and providing the n-th data DQn in synchronization with the converted pair of clock signals. Each of the first local driver 824-1, the second local driver 824-2, and the n-th local driver 824-n may include a CML to CMOS converter.

The second semiconductor apparatus 820 may further include a first boosting circuit 825-1, a second boosting circuit 825-2, and a n-th boosting circuit 825-n. The first boosting circuit 825-1 may be coupled between the clock transmission driver 823 and the first local driver 824-1 and the second boosting circuit 825-2 and may boost the pair of clock signals output from the clock transmission driver 823. The second boosting circuit 825-2 may be coupled between the first boosting circuit 825-1 and the second local driver 824-2 and may boost the pair of clock signals output from the first boosting circuit 825-1. The n-th boosting circuit 825-n may be coupled between the boosting circuit of a previous stage and the n-th local driver 824-n and may boost the pair of clock signals to be provided to the n-th local driver 824-n.

While certain embodiments have been described above, it will be understood by those skilled in the art that the embodiments described represent examples only. Accordingly, the clock distribution network, a semiconductor apparatus, and a semiconductor system using the same should not be limited based on the described embodiments. Rather, the clock distribution network, a semiconductor apparatus, and a semiconductor system using the same described herein should only be limited in light of the claims that follow when taken in conjunction with the above description and accompanying drawings.

What is claimed is:

1. A clock distribution network comprising:
    a global driver configured to receive a pair of clock signals to generate a pair of global clock signals;
    a clock transmission driver configured to amplify the pair of global clock signals to generate a pair of transmission clock signals;
    a first boosting circuit configured to boost voltage levels of the pair of transmission clock signals to generate a pair of first boosted clock signals;
    a first local driver configured to shift voltage levels of the pair of first boosted clock signals to generate a pair of first local clock signals;
    a second boosting circuit configured to boost voltage levels of the pair of first boosted clock signals to generate a pair of second boosted clock signals; and
    a second local driver configured to shift voltage levels of the pair of second boosted clock signals to generate a pair of second local clock signals.

2. The clock distribution network of claim 1, wherein the clock transmission driver is a Current Mode Logic (CML) driver.

3. The clock distribution network of claim 1,
    wherein the clock transmission driver is further configured to receive a current control signal, and
    wherein a gain of the clock transmission driver is controlled based on the current control signal.

4. The clock distribution network of claim 1, wherein the first boosting circuit is configured to generate the pair of first boosted clock signals having an alternating current (AC) gain that is increased relative to the pair of transmission clock signals.

5. The clock distribution network of claim 1,
wherein the first boosting circuit is further configured to receive a current control signal, and
wherein an AC gain of the first boosting circuit is controlled based on the current control signal.

6. The clock distribution network of claim 1, wherein the first local driver is configured to shift the voltage levels of the pair of first boosted clock signals having a CML level to generate the pair of first local clock signals having a Complementary Metal-Oxide Semiconductor (CMOS) level.

7. The clock distribution network of claim 1, wherein the second boosting circuit is configured to generate the pair of second boosted clock signals having an AC gain that is increased relative to the pair of first boosted clock signals.

8. The clock distribution network of claim 1,
wherein the second boosting circuit is further configured to receive a current control signal, and
wherein an AC gain of the second boosting circuit is controlled based on the current control signal.

9. The clock distribution network of claim 1, wherein the second local driver is configured to shift the voltage levels of the pair of second boosted clock signals having a CML level to generate the pair of second local clock signals having a CMOS level.

10. A semiconductor apparatus comprising:
a first local driver configured to receive a pair of first transmission clock signals and shift voltage levels of the pair of first transmission clock signals to generate a pair of first local clock signals;
a first data input/output circuit configured to perform a data input/output operation in synchronization with the pair of first local clock signals;
a first boosting circuit configured to boost voltage levels of the pair of first transmission clock signals to generate a pair of second transmission clock signals;
a second local driver configured to receive the pair of second transmission clock signals and shift voltage levels of the pair of second transmission clock signals to generate a pair of second local clock signals; and
a second data input/output circuit configured to perform a data input/output operation in synchronization with the pair of second local clock signals.

11. The semiconductor apparatus of claim 10, wherein the first local driver is configured to shift the voltage levels of the pair of first transmission clock signals having a Current Mode Logic (CML) level to generate the pair of first local clock signals having a Complementary Metal-Oxide Semiconductor (CMOS) level.

12. The semiconductor apparatus of claim 10, wherein the first boosting circuit is configured to generate the pair of second transmission clock signals having an alternating current (AC) gain that is increased relative to the pair of first transmission clock signals.

13. The semiconductor apparatus of claim 10, wherein the second local driver is configured to shift the voltage levels of the pair of second transmission clock signals having a CML level to generate the pair of second local clock signals having a CMOS level.

14. The semiconductor apparatus of claim 10, further comprising:
a global driver configured to receive a pair of clock signals to generate a pair of global clock signals; and
a clock transmission driver configured to amplify the pair of global clock signals to generate the pair of first transmission clock signals.

15. The semiconductor apparatus of claim 14, wherein the clock transmission driver is a CML driver.

16. The semiconductor apparatus of claim 14,
wherein the clock transmission driver is further configured to receive a first current control signal, and
wherein a gain of the clock transmission driver is controlled based on the first current control signal.

17. The semiconductor apparatus of claim 16, further comprising a second boosting circuit configured to boost the voltage levels of the pair of first transmission clock signals.

18. The semiconductor apparatus of claim 17,
wherein the second boosting circuit is further configured to receive a second current control signal, and
wherein an AC gain of the second boosting circuit is controlled based on the second current control signal.

19. The semiconductor apparatus of claim 17,
wherein the first boosting circuit is further configured to receive a third current control signal, and
wherein an AC gain of the first boosting circuit is controlled based on the third current control signal.

* * * * *